United States Patent
Sofia et al.

(10) Patent No.: US 10,447,296 B1
(45) Date of Patent: Oct. 15, 2019

(54) ACCELERATED COMPRESSION/DECOMPRESSION INCLUDING PREDEFINED DICTIONARY

(71) Applicant: INTERNATIONAL BUSINESS MACHINES CORPORATION, Armonk, NY (US)

(72) Inventors: Anthony T. Sofia, Hopewell-Junction, NY (US); Matthias Klein, Poughkeepsie, NY (US); Peter G. Sutton, Lagrangeville, NY (US)

(73) Assignee: INTERNATIONAL BUSINESS MACHINES COPORATION, Armonk, NY (US)

( * ) Notice: Subject to any disclaimer, the term of this patent is extended or adjusted under 35 U.S.C. 154(b) by 0 days.

(21) Appl. No.: 16/015,692

(22) Filed: Jun. 22, 2018

(51) Int. Cl.
*H03M 7/34* (2006.01)
*H03M 7/30* (2006.01)

(52) U.S. Cl.
CPC .................. *H03M 7/3088* (2013.01)

(58) Field of Classification Search
CPC .................................. H03M 7/0388
USPC ........................... 341/50, 51, 106
See application file for complete search history.

(56) References Cited

U.S. PATENT DOCUMENTS

| 8,943,024 B1 | 1/2015 | Gardner et al. |
| 9,148,402 B2 * | 9/2015 | Pratapa ................. H04L 61/255 |
| 9,455,864 B2 * | 9/2016 | Alstad .................... H04L 69/04 |
| 9,652,384 B2 | 5/2017 | Trika et al. |
| 9,792,044 B2 | 10/2017 | Shih |
| 2012/0257626 A1 | 10/2012 | McGhee et al. |
| 2013/0268497 A1 | 10/2013 | Baldwin et al. |
| 2015/0178214 A1 | 6/2015 | Alameldeen et al. |
| 2015/0227565 A1 * | 8/2015 | Amit ................... G06F 16/2246 707/797 |
| 2016/0283398 A1 | 9/2016 | Abali et al. |

FOREIGN PATENT DOCUMENTS

WO 20170069897 A1 4/2017

* cited by examiner

*Primary Examiner* — Peguy Jean Pierre
(74) *Attorney, Agent, or Firm* — Cantor Colburn LLP; William Kinnaman

(57) ABSTRACT

A computer system includes a hardware controller and an internal millicode storage area. The controller includes an accelerator that decompresses a data stream requested by an application. The internal millicode storage area can store a compression dictionary library including a plurality of different pre-defined compression dictionaries. A host system includes a dictionary manager that determines a compression dictionary from the plurality of different pre-defined compression dictionaries included in the dictionary library to decompress the data stream. The accelerator can access the internal millicode storage area to obtain the determined compression dictionary, and to decompress the data stream according to the determined compression dictionary.

17 Claims, 6 Drawing Sheets

ACCELERATED COMPRESSION/DECOMPRESSION INCLUDING PREDEFINED DICTIONARY

BACKGROUND

The present invention relates to digital computer systems, and more particularly, to digital data compression and decompression schemes employed in digital computer systems.

Digital computer systems perform data compression to realize a more efficient use of finite storage space. The computer system typically includes a hardware component referred to as an accelerator, which accepts work requests or data requests from the host system to compress or decompress one or more blocks of the requested data. When designing an accelerator to perform compression, there is a tradeoff between the size of the input data that is to be compressed compared to the possible compression ratio and the latency that results from compressing the data.

SUMMARY

According to a non-limiting embodiment, a computer system is provided that includes a hardware controller and an internal millicode storage area. The controller includes an accelerator that decompresses a data stream requested by an application. The internal millicode storage area stores a compression dictionary library including a plurality of different pre-defined compression dictionaries. A host system includes a dictionary manager that determines a compression dictionary from the plurality of different pre-defined compression dictionaries included in the dictionary library to decompress the data stream. In at least one non-limiting embodiment, the accelerator accesses the internal millicode storage area to obtain the determined compression dictionary, and decompresses the data stream according to the determined compression dictionary.

According to another non-limiting embodiment, method of controlling a computer system is provided. The method comprises requesting, via an application, decompression of a data stream, and storing, via an internal millicode storage area, a compression dictionary library that includes a plurality of different pre-defined compression dictionaries. The method further includes determining, via a dictionary manager controlled by a host system installed on the computer system, a compression dictionary from the plurality of different pre-defined compression dictionaries to decompress the data stream. In at least one non-limiting embodiment, the method further includes accessing the internal millicode storage area, via an accelerator, and obtaining the determined compression dictionary, and decompressing the data stream, via the accelerator according to the determined compression dictionary obtained from the internal millicode storage area.

According to yet another non-limiting embodiment, a computer program product is provided to control computer system to decompress data. The computer program product comprises a computer readable storage medium having program instructions embodied therewith. The program instructions are executable by an electronic computer processor to control the computer system to perform operations comprising requesting, via an application, decompression of a data stream, and storing, via an internal millicode storage area, a compression dictionary library that includes a plurality of different pre-defined compression dictionaries. The method further includes determining, via a dictionary manager controlled by a host system installed on the computer system, a compression dictionary from the plurality of different pre-defined compression dictionaries to decompress the data stream. In at least one non-limiting embodiment, the method further includes accessing the internal millicode storage area, via an accelerator, and obtaining the determined compression dictionary, and decompressing the data stream, via the accelerator according to the determined compression dictionary obtained from the internal millicode storage area.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
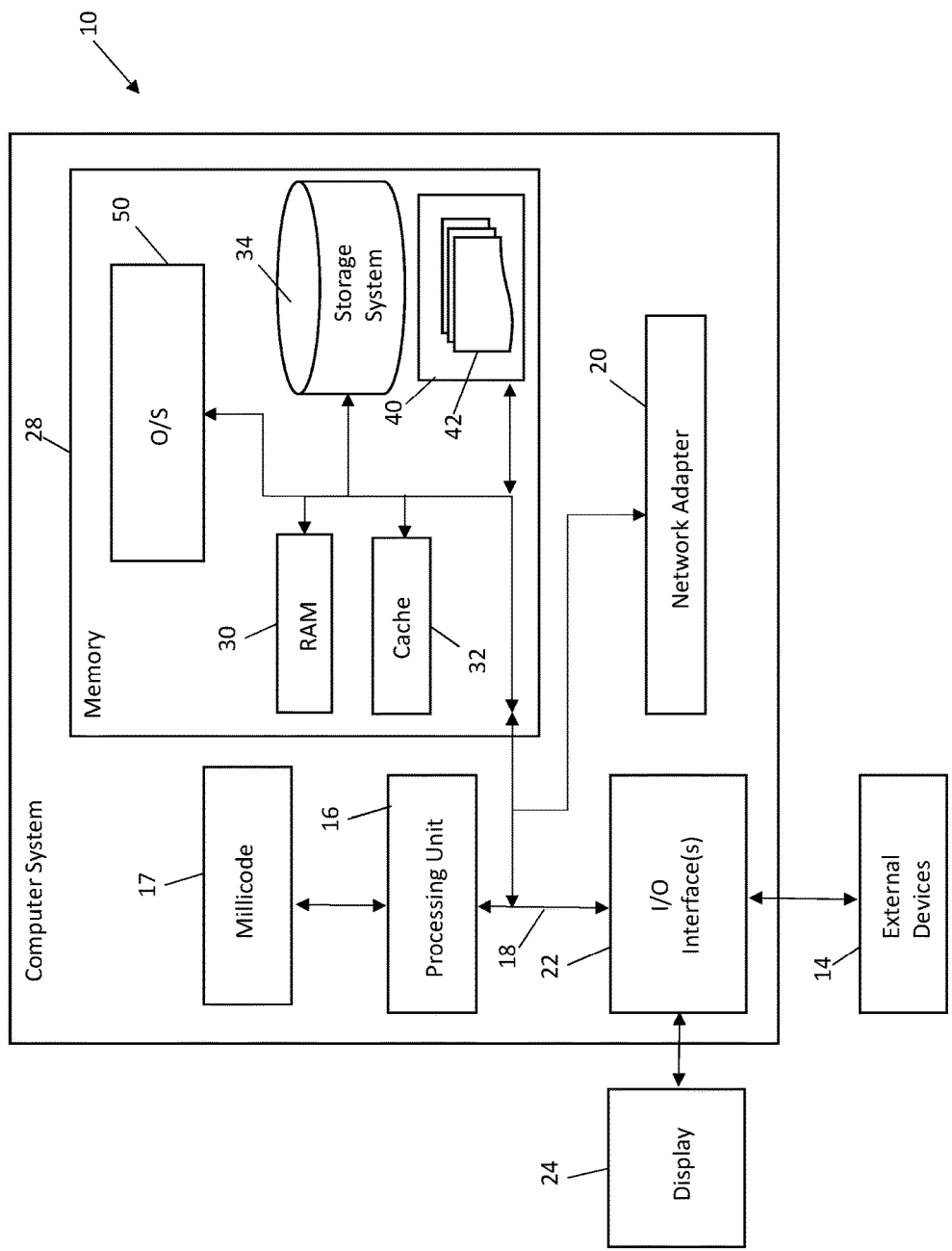
FIG. 1 is a block diagram illustrating a computer system which is capable of compressing and decompressing data in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, it is common in the industry that data to be compressed by the accelerator is not made completely available at a given time for compression. For example, a 1 megabyte (MB) request may be broken into several individual requests or smaller individual data blocks (e.g., several individual 512 byte blocks). In order to compress the smaller data blocks effectively, the history from the several previous KB compression results are generated for each individual small data block request (e.g., 512 bytes) in order to identify matches or matching strings. The history is then stored in a compression dictionary, which is used by the accelerator to subsequently decompress the data.

For example, compression dictionaries are typically built using lossless data compression algorithms that operate by searching for matches between data to be compressed and a set of strings contained in a compression dictionary data structure that is maintained by an accelerator. When the accelerated compression dictionary finds a match, it substitutes a reference to the string's position in the data and thus avoids the need to copy and transfer the entirety of the matching data. The compression dictionary data structure can include 32 KB from start to finish.

During operation of the accelerator, the compression dictionary can be initially empty or reset/zeroed. Over time, as more and more matching data strings are encountered, the compression dictionary can be filled until it reaches maximum capacity. At this point, any further data strings to be added to the compression dictionary can be added onto its end with the corresponding deletion of older data strings at the start. The built compression dictionary can then be used by the accelerator to subsequently decompress data.

There is another use-case where the total data itself is a small value, e.g. only 512 bytes. In either case, a compression algorithm that uses pattern matching and repeated data replacement schemes, i.e., look backs or utilizes compression history to find matches or matching strings (e.g., LZ77-type technology) would not be very effective as it would be highly unlikely to find significant repeating patterns within the 512 byte data block.

As described herein, one or more embodiments address the above-described shortcomings of the prior art by providing a digital computer system that implements an accelerator capable of compressing and decompression very small data sizes (e.g., a single 512 B data block). In at least one embodiment, the OS can allocate a portion of memory to store different pre-defined lookback dictionaries (also referred to compression dictionaries), which are utilized by the accelerator to perform decompression. In at least one embodiment, the OS can select a particular compression dictionary, and deliver it to the accelerator with a data command informing the accelerator to use the selected compression dictionary to perform the data compression.

According to another embodiment, the computer system includes internal millicode, which stores different pre-defined compression dictionaries that can be used to control the accelerator to decompress the data. Instead of allowing the OS to allocate memory to store the different compression dictionaries, the pre-defined compression dictionaries are stored in the internal millicode. In at least one embodiment, the software (OS) can actively load additional pre-defined compression dictionaries into the internal millicode, which can later be accessed by the accelerator. In this embodiment, the OS can deliver a command or control signal to the accelerator indicating which compression dictionary to use for decompressing the data. In turn, the accelerator can obtain the indicated compression dictionary from the internal millicode, and perform the data decompression accordingly. Accordingly, various embodiments described herein allow use-cases of very small records, such as database rows, to leverage a hardware accelerator that requires validation of memory. In this manner, different compression dictionaries can be made available to the accelerator while eliminating overhead to validate the memory.

With reference now to FIG. 1, a computer system 10 is illustrated in accordance with a non-limiting embodiment of the present disclosure. The computer system 10 may be based on the z/Architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a general-purpose computing device, also referred to as a processing device. The components of computer system 10 may include, but are not limited to, one or more processors or processing units 16, internal millicode 17, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include a library API (not shown in FIG. 1). The library API is a software library comprising APIs for performing the data manipulation functions provided by the specialized hardware devices such as, for example, an accelerator (not shown in FIG. 1).

The storage system 34 can store a basic input output system (BIOS). The BIOS is a set of essential routines that initialize and test hardware at startup, start execution of the OS 50, and support the transfer of data among the hardware devices. When the computer system 10 is in operation, one or more processors 16 are configured to execute instructions stored within the storage system 34, to communicate data to and from the memory 28, and to generally control operations of the computer system 10 pursuant to the instructions.

One or more of the processors 16 can also access the internal millicode 17 and data stored therein. The internal millicode 17 can be viewed as a data storage area that is separate and different from the main memory 28 and can be accessed or controlled independent from the OS. The internal millicode 17 contains millicode that is part of the complex architected instructions of the computer system 10. A complex instruction can be defined as a single instruction to the programmer; however, it may also include internally licensed code which breaks one complex instruction into many less complex instructions. The millicode contains algorithms that have been designed and tested specifically for computer system 10 and can provide full control over the hardware. In at least one embodiment, the millicode 17 can also be utilized to store one or more compression dictionaries, which can be delivered to the hardware to facilitate data decompression as described in greater detail below.

Program/utility 40, having a set (at least one) of program modules 42, may be stored in memory 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
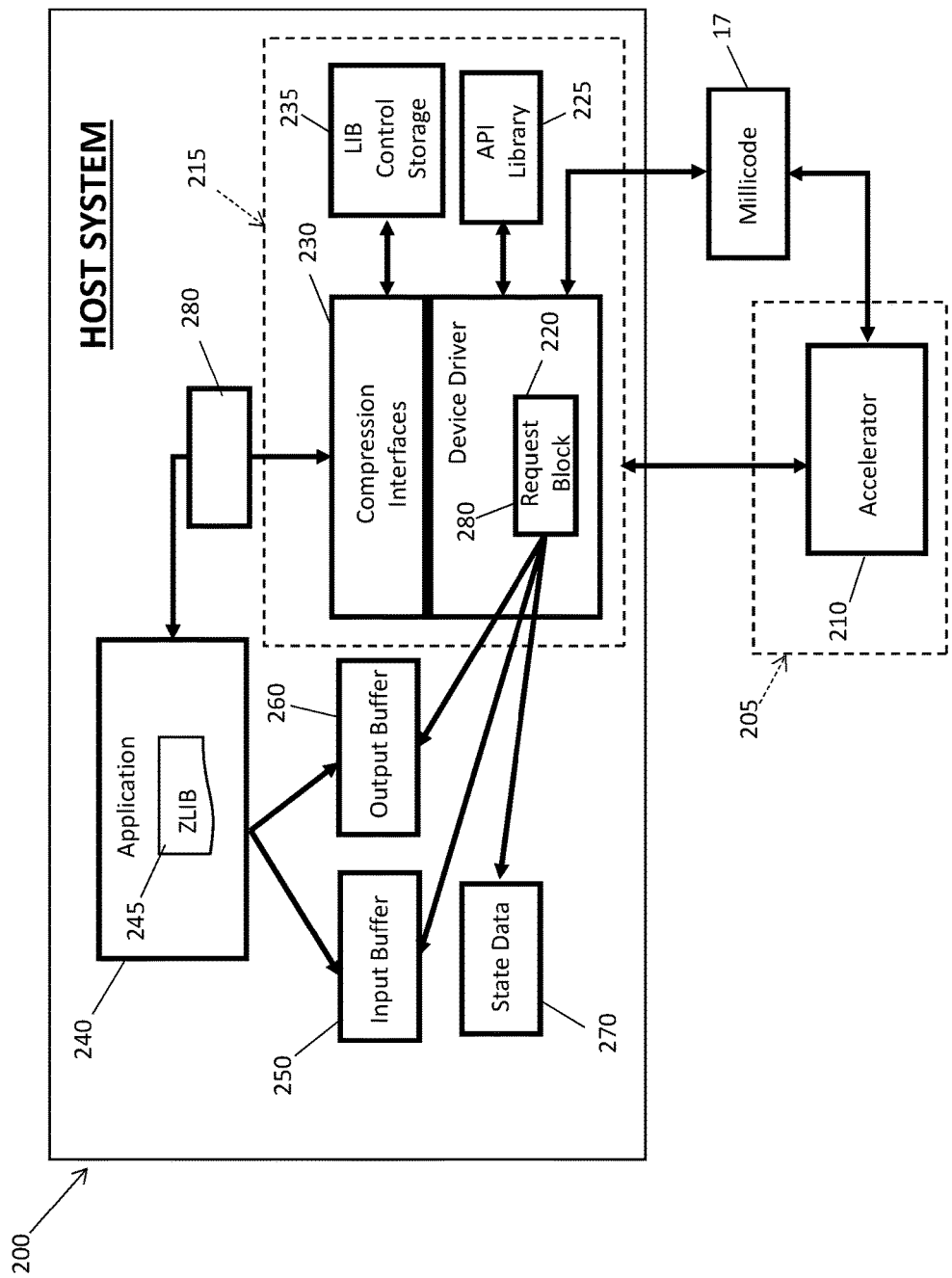
FIG. 2 is a block diagram of a host system in signal communication with a hardware component according to a non-limiting embodiment.

With reference to FIG. 2, a host system 200 is illustrated in signal communication with one or more computing hardware components 205 according to a non-limiting embodiment. The host system 200 and the hardware component 205 can be implemented in one or more processing units 16 and can operate in combination with the other components of the computer system 10 described in FIG. 1.

The hardware component 205 includes, but is not limited to, an electronic hardware controller installed with an accelerator 210 configured to perform data compression and/or data decompression. According to a non-limiting embodiment, the accelerator 210 can be shared among multiple host systems, but for simplicity only one host system 200 is shown in FIG. 2. The interaction between the accelerator 210 and the host system 200 can be controlled by the host system's operating system (OS) 215.

The host OS 215 includes a device driver 220 capable of providing one or more compression interfaces 230, one or more API libraries 225, and a compression library control storage unit 235. The OS 215 can also provide different compression and decompression functions including, but not limited to, a function to discover if certain compression/decompression services are available, a function to determine if a user of the current task has access to use a given compression/decompression service, and a function to obtain a given compression/decompression service from an external source.

The host system 200 is capable of running one or more applications 240 to facilitate data compression. The application 240 is installed with one or more compression libraries 245. The figures reference a "zlib" in the figures; however, the disclosure is of course not limited to any particular library. The compression library 245 is compatible with the compression interfaces 230 of the OS 215 and informs the accelerator 210 (e.g., via one or more parameter data blocks) of the specific encoding scheme to be used to compress the requested data or data stream.

The compression library 245 can also access the API library 225 and the compression library control storage unit 235. The API library 225 can be accessed to provide the application 240 with an API capable of calling different compression and decompression functions provided by the OS 215.

The compression library control storage unit 235 includes various memory fields that are controlled by the OS 215 but can be accessed by the compression library 245. For instance, various memory fields in the compression library control storage unit 235 may be specifically allocated to the compression library 245 for its access but can be dynamically filled by the OS 215 with data that controls the behavior of the compression library 245. The compression library 245 has instructions to read the data from these fixed memory fields and operate accordingly. Therefore, the OS 50 can control the behavior of the compression library 245 based on the data added to the fixed memory fields of the compression library control storage unit 235.

In one or more embodiments, uncompressed data is obtained by the application 240 and is passed by a pointer to the compression library 245. The compression library 245 passes the pointer to the operating system 215 for the data buffer. In turn, the operating system 215 passes the buffer data indicated by the pointer to the hardware 205, and the accelerator 210 performs an initial data compression on the data provided by the application 240. The initial compressed data can be stored in the output buffer 260, and then passed by a pointer between the OS 215 and the compression library 245. In the event a flush operation is performed, then the compression library 245 possesses information indicating which compressed output buffer of data that it can operate on. The operations of the compression library 245 include performing an additional compression operation such as a "DEFLATE" operation, for example, on the compressed data obtained from the output buffer to generate final compressed data. The "DEFLATE" operation can include injecting control data, such as an EOB symbol, into the EOB of the compressed data obtained from the output buffer.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". In order to Huffman encode and decode data, a system must know in advance that the Huffman tree is being used. In order to accommodate decompression (e.g., an "Inflate" operation), the Huffman tree is written at the header of every compressed block. In one embodiment, two options are provided for Huffman trees in the Deflate standard. One option is a "static" tree, which is a single hard-coded Huffman tree, known to all compressors and decompressors. The advantage of using this static tree is that its description does not have to be written in the header of a compressed block, and is ready for immediate decompression. On the other hand, "dynamic" trees are tailored for the data block at hand and an exact description of the dynamic tree must, therefore, be written to the output.

Huffman encoding may also use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method may achieve a lower compression ratio than is possible. This is due to using a fixed encoding table regardless of the content of the input data block. For example, random data and a four-letter DNA sequence would be encoded using the same Huffman table.

The compression library 245 can be implemented in the application 240 as a software library used for deflation/inflation and can be an abstraction of a compression algorithm. The compression library 245 obtains this compressed data and further performs a "DEFLATE" operation on the compressed data to generate a final compressed data. The "DEFLATE" operation includes injecting control data, such as an EOB symbol, into the EOB.

In at least one embodiment, the compression library 245 allows the application 240 to break up input data to be deflated/inflated in arbitrary ways across multiple requests and provides arbitrary sized output buffers to hold the results of the deflate/inflate operation. Since the zlib compression algorithm, for example, employs the Lempel-Ziv77 type compression followed by a layer of a Huffman encoding, it achieves an increased compression ratio when the techniques are performed effectively. Even more so, the output adheres to a well-accepted standard (e.g., the DEFLATE compression format). As such, it is supported by a wide variety of web browsers and applications. Several different versions of the compression library 245 can exist and can be included with a given application 240. The compression library 245 can also allow for either the off-the-shelf software compression or decompression, along with providing a second path that can optionally communicate with the OS 215 to perform compression and/or decompression.

To initiate data compression, the application 240 outputs one or more requests to compress targeted data or a targeted data stream. A request block 280 can be used to facilitate the request. The request block 280 is delivered to the compression interface 230 of the OS 215. On each request, the application 240 can supply an input buffer 250 with the data to be processed and an output buffer 260 where the processed data results are stored. On the first request of a stream, the device driver 220 of the OS 215 receives a data control block from compression library 245 which includes a stream state 270 for the data stream and may exist for the life of the data stream according to an embodiment. For each request, the device driver 220 can generate a request block 280, which can include references to the stream state 270 and the application's input buffer 250 and output buffer 260. According to a non-limiting embodiment, the accelerator 210 is able to access the input buffer 250 and/or output buffer 260. Thus, the accelerator 210 can compress the data in the input buffer 250 if compression thresholds included in the request block 280 indicate that hardware compression is necessary. The resulting data compressed by the accelerator can then be added to the output buffer 260 and further accessed by the compression library 245 and/or application 240.

To begin processing the compression request, the accelerator 210 reads the request block 280, and processes the data in the input buffer 250 to generate compressed or and/or decompressed data using an installed compression algorithm. As described herein, various compression algorithms can be employed including, but not limited to, the DEFLATE compression algorithm and ALDC algorithms. The resulting compressed data can be saved in the output buffer 260. According to a non-limiting embodiment, the accelerator 210 can also save an updated stream state 270 when directed by the device driver 220.

Figure 3:
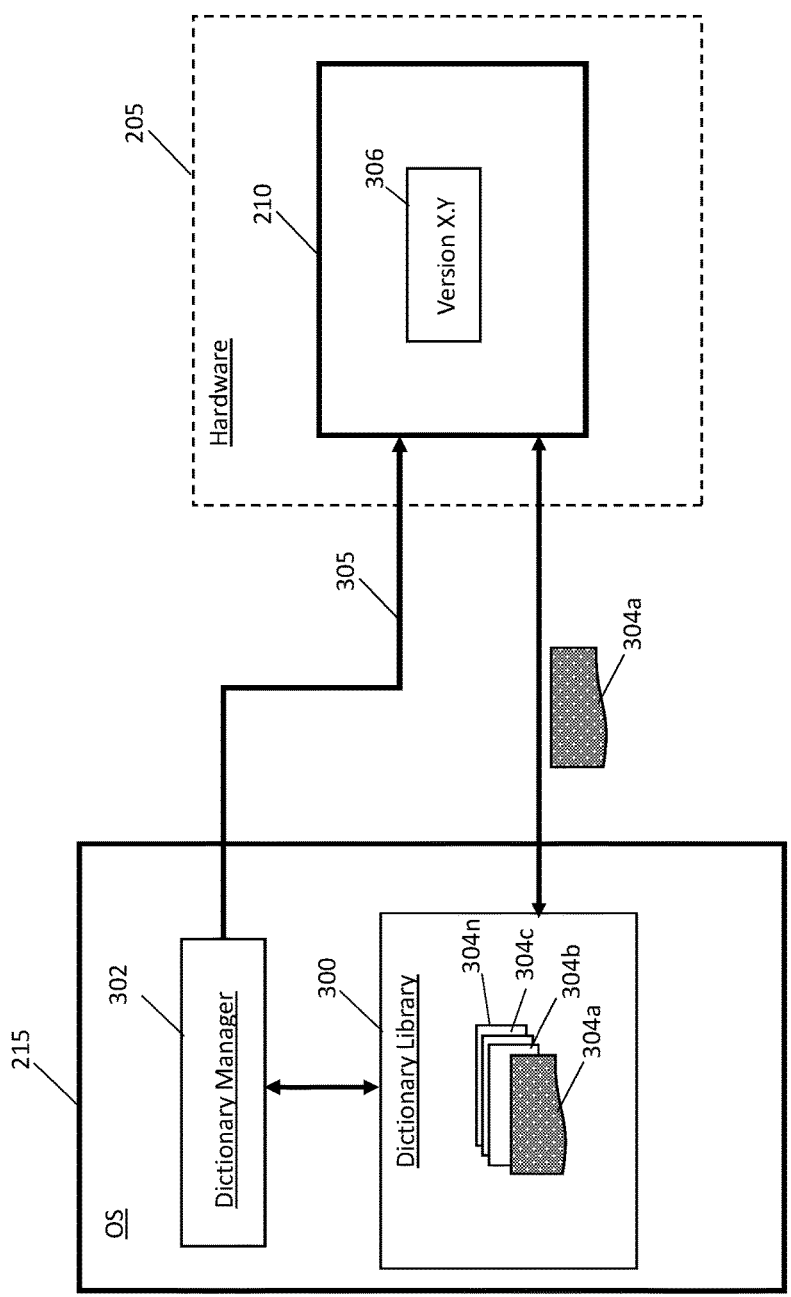
FIG. 3 is a block diagram illustrating a communication exchange between an OS and an accelerator included in the computer system according to a non-limiting embodiment.

With reference to FIG. 3, a block diagram illustrates the exchange of one or more pre-defined compression dictionaries between the OS 215 and the accelerator 210 according to a non-limiting embodiment. The OS 215 includes a compression dictionary library 300 and a dictionary manager 302. The compression dictionary library 300 is pre-loaded with several different types of compression dictionaries 304a, 304b, 304c, 304n. For instance, a first compression dictionary 304a can be used to compress/decompress mainframe-based text data, a second compression dictionary 304b can be used to compress/decompress binary data, a third compression dictionary 304c can be used to compress/decompress ASCII text, a fourth compression dictionary 304n can be used to compress/decompress non-English text, etc.

The dictionary manager 302 can be controlled by a processor (not shown in FIG. 3) and is configured to select the appropriate compression dictionary 304a, 304b, 304c, 304n that corresponds to data or a given data stream to be decompressed. In at least one non-limiting embodiment, the OS 215 initiates communication with the accelerator 210 upon system initialization (e.g., the startup of the computer system). The communication includes requesting the accelerator 210 to provide information indicating its current version. In response to the request, the accelerator 210 reads the data indicating the current version from hardware storage 306 and returns a status signal indicating the current version of the accelerator 210.

The OS 215 informs the dictionary manager 302 of the current data or data stream to be compressed (e.g., mainframe-based text data, binary data, ASCII text, non-English text, etc.). In at least one embodiment, the dictionary manager 302 is programmed to select a particular compression dictionary compression dictionaries 304a, 304b, 304c, 304n based on the type of data or data stream to be compressed. In another embodiment, the dictionary manager 302 can actively learn which compression dictionary compression dictionaries 304a, 304b, 304c, 304n. For example, the OS 215 can store in memory a history of compression ratios that result from using different compression dictionaries with different types of data or data streams. The dictionary manager 302 can predict the compression ratio that may result from using a particular compression dictionary by referring to the compression ratio history for a given data type. Based on the predicted compression ratio, the dictionary manager 302 can select the compression dictionary 304a, 304b, 304c, 304n that provides to the most optimal compression ratio for a given type of data or data stream to be compressed.

In either case, described above, the dictionary manager 320 accesses the compression dictionary library 300 and selects the appropriate compression dictionary (e.g. 304a) which corresponds to the current data or data to be decompressed. The selected compression dictionary (e.g. 304a) is then output to the accelerator 210, and the OS 215 (e.g., the dictionary manager 302) outputs a dictionary identification (ID) signal 305 (e.g., binary value associated with a given dictionary) informing the accelerator 210 that the selected compression dictionary (e.g., 304a) should be used to decompress the current data or data stream. In this manner, the accelerator 210 is provided with the compression dictionary that provides the most optimal compression ratio, regardless of the type or size of the data or data stream to be compressed. Because the accelerator 210 itself is not required to determine the compression dictionary, the latency of the accelerator reduced and the overall computer system performance is improved.

Figure 4:
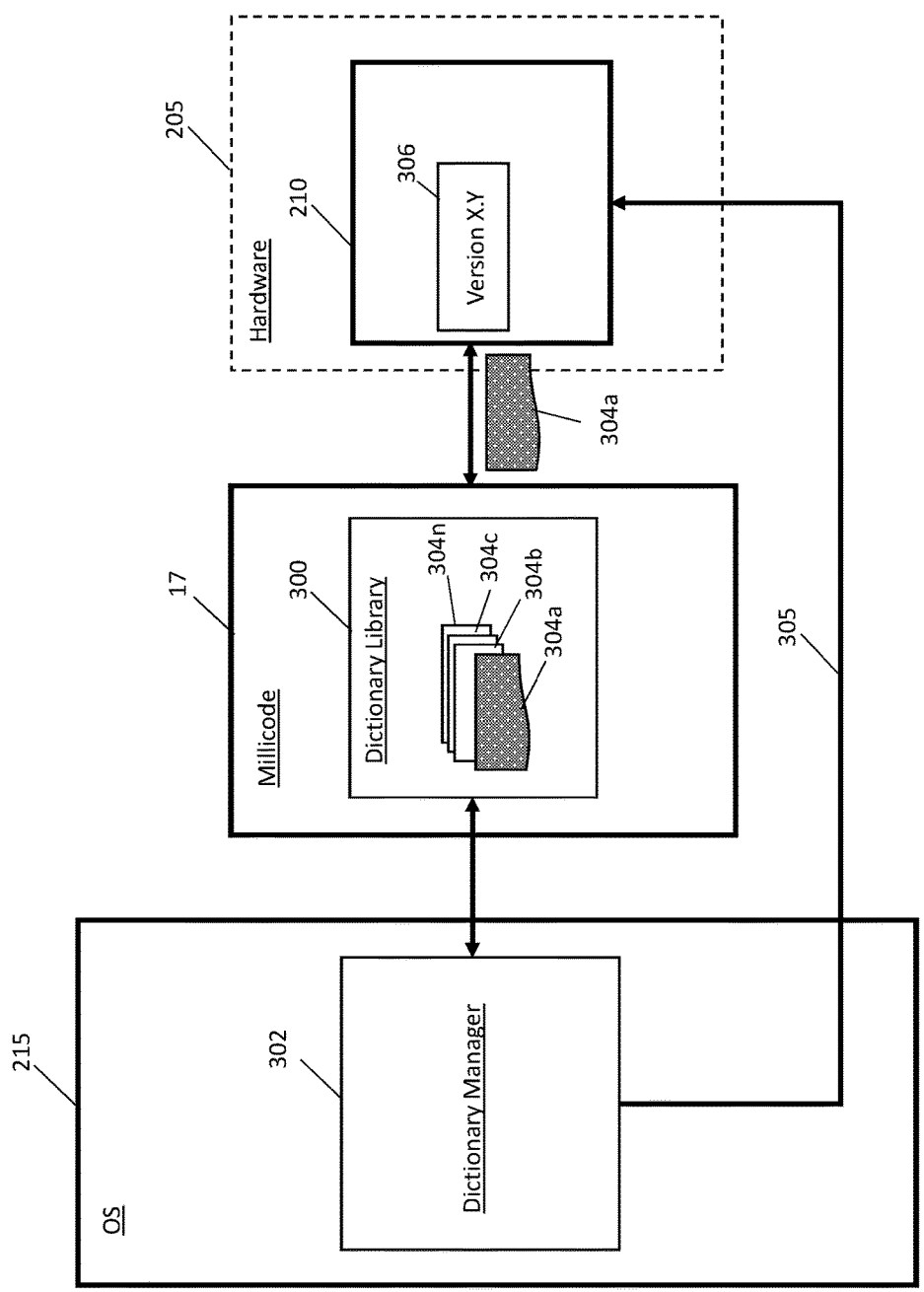
FIG. 4 illustrates a communication exchange between an OS, millicode and an accelerator according to a non-limiting embodiment.

Turning now to FIG. 4, a block diagram illustrates the exchange of one or more pre-defined compression dictionaries to the accelerator 210 according to another non-limiting embodiment. In this embodiment, internal millicode 17 included in the computer system 10 is utilized to facilitate the exchange of the pre-defined compression dictionaries. For instance, the millicode 17 includes a compression dictionary library 300 that is preloaded with several different types of compression dictionaries 304a, 304b, 304c, 304n as described above. The dictionary manager 302 can still be operated under the control of the OS 215 and is capable of communicating with the accelerator 210 in addition to accessing the millicode 17.

As described herein, the OS 215 can inform the dictionary manager 302 the type of data to be decompressed (e.g., mainframe-based text data, binary data, ASCII text, non-English text, etc.). In turn, the dictionary manager 302 can identify the correct compression dictionary (e.g., dictionary 304a) from the dictionary library 300 stored in the millicode 17, and then output a dictionary identification (ID) signal 305 (e.g., binary value associated with a given dictionary) informing the accelerator 210 which dictionary should be used to decompress the current data or data stream. As described herein, the dictionary manager 302 can select a compression dictionary 304a, 304b, 304c, 304n that matches the data type to be compressed, or can select the compression dictionary that achieves the most optimal compression ratio when decompressing the data type of the current data or data stream. In response to the dictionary identification (ID) signal 305, the accelerator 210 can access the millicode 17 and obtain the corresponding compression dictionary (e.g., dictionary 304a) from the dictionary library 300.

Figure 5:
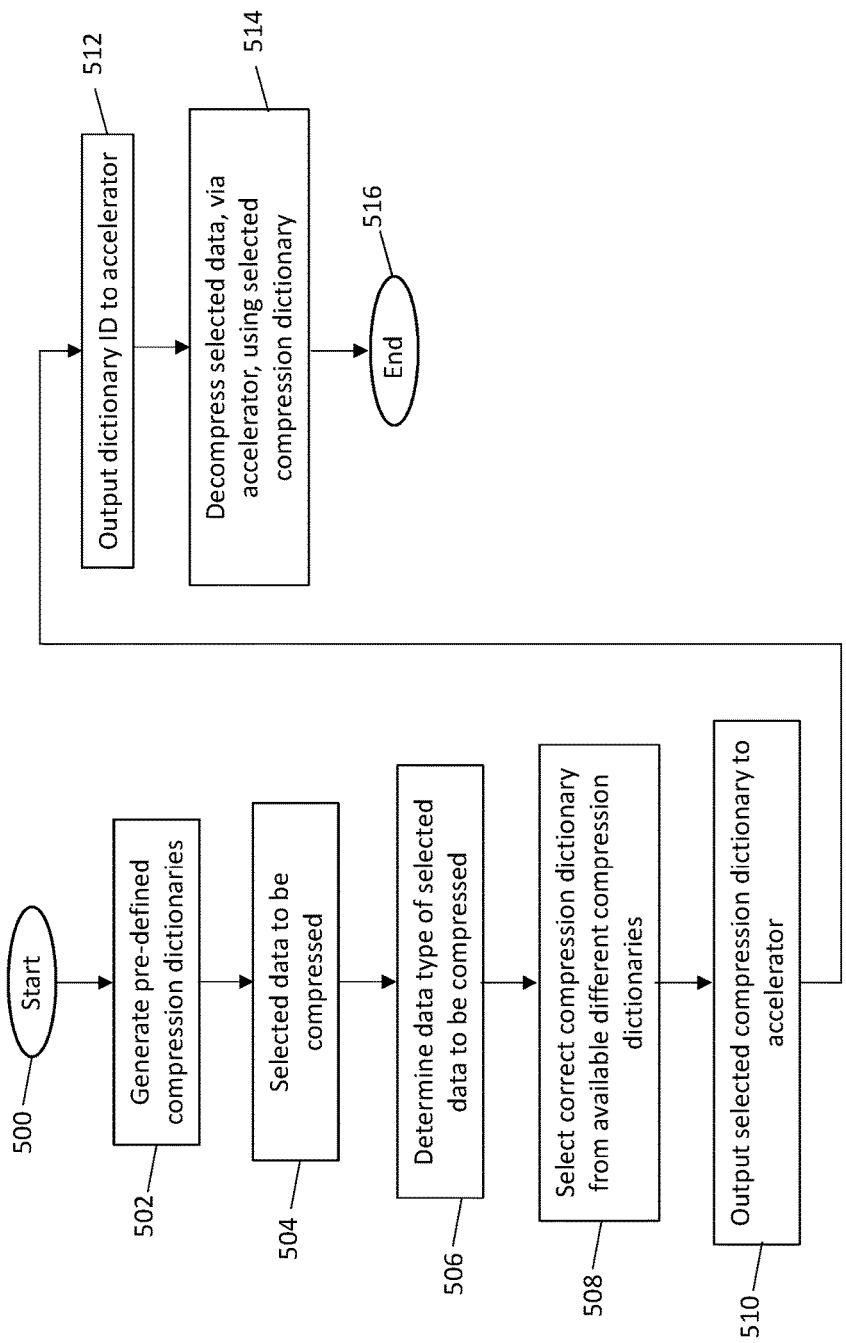
FIG. 5 is a flow diagram illustrating a method of performing accelerated compression/decompression according to a non-limiting embodiment.

With reference now to FIG. 5, a method of performing accelerated compression/decompression based on pre-defined compression dictionaries is illustrated according to a non-limiting embodiment. The method begins at operation 500, and at operation 502 one or more pre-defined compression dictionaries are generated. In at least one embodiment, the system generates several different types of compression dictionaries based on the type of data to be compressed (e.g., mainframe-based text data, binary data, ASCII text, non-English text, etc.). Each pre-defined compression dictionary is stored in a dictionary library, which can be stored in memory controlled by the OS.

At operation 504, data or a data stream to be compressed is selected. At operation 506, a dictionary manager determines the data type (e.g., mainframe-based text data, binary data, ASCII text, non-English text, etc.) of the selected data to be compressed. At operation 508, the dictionary manager selects the correct compression dictionary from among the various different available compression dictionaries stored in the dictionary library. The dictionary manager can select a compression dictionary that matches the data type to be compressed or can select the compression dictionary that achieves the most optimal compression ratio when compressing the data type of the selected data. At operation 510, the selected compression dictionary is output from the dictionary library to the accelerator. In at least one embodiment, the dictionary manager also outputs a dictionary identification (ID) signal at operation 312. The dictionary ID informs the accelerator to use the selected compression dictionary to perform decompression on the selected data. At operation 514, the accelerator decompresses the selected data using the selected compression dictionary obtained from the dictionary library, and the method ends at operation 516.

Figure 6:
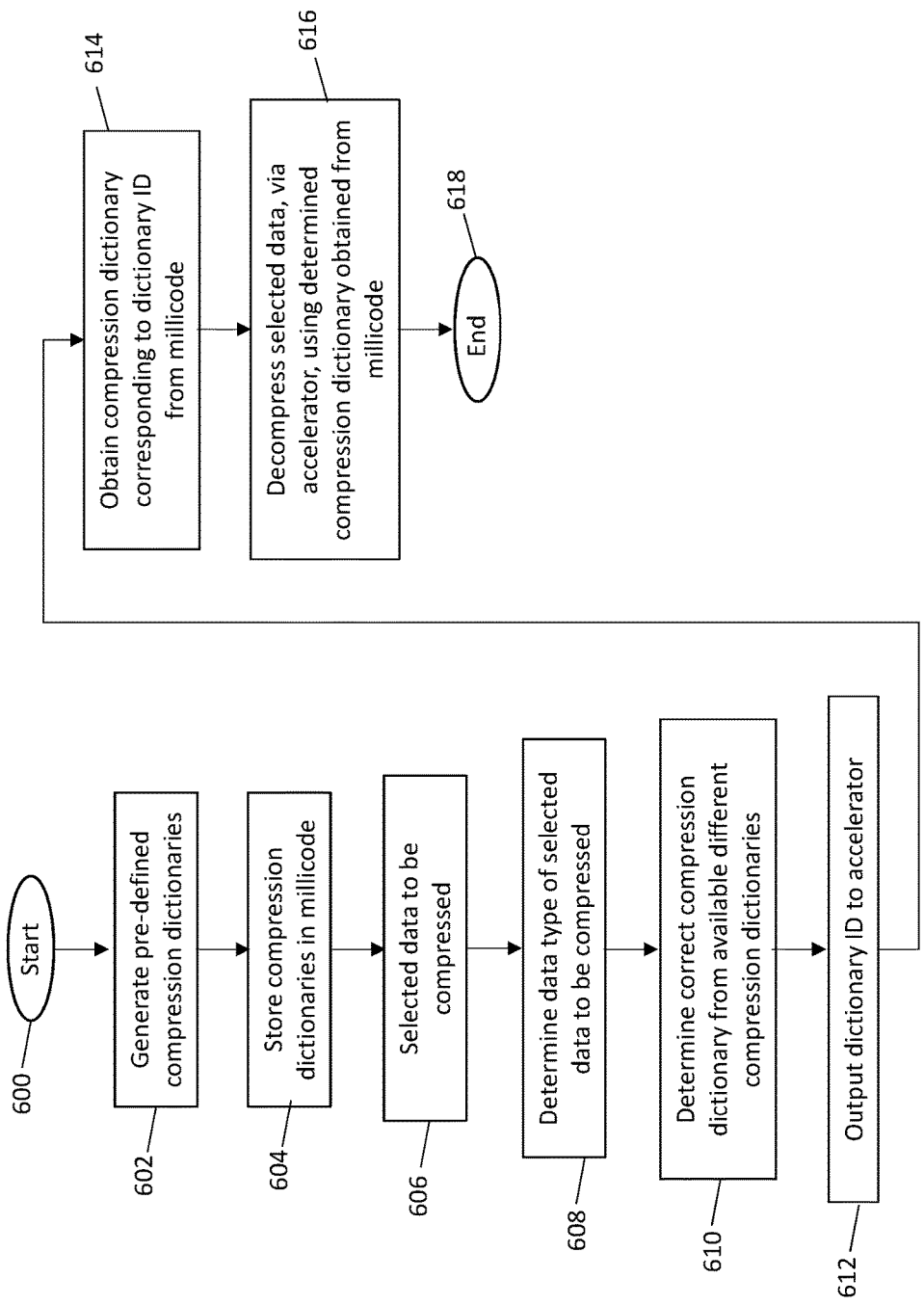
FIG. 6 is a flow diagram illustrating a method of performing accelerated compression/decompression according to another non-limiting embodiment.

Referring to FIG. 6, a method of performing accelerated compression/decompression based on predefined compression dictionaries is illustrated according to another non-limiting embodiment. The method begins at operation 600, and at operation 602 one or more pre-defined compression dictionaries are generated. In at least one embodiment, the system generates several different types of compression dictionaries based on the type of data to be compressed (e.g., mainframe-based text data, binary data, ASCII text, non-English text, etc.). Each pre-defined compression dictionary is organized in a dictionary library and stored in the internal millicode of the computer system at operation 604. The internal millicode is separate and different from the main memory of the system and can be accessed or controlled independent from the OS.

At operation 606, data or a data stream to be compressed is selected. At operation 608, a dictionary manager determines the data type (e.g., mainframe-based text data, binary data, ASCII text, non-English text, etc.) of the selected data to be compressed. At operation 610, the dictionary manager determines the correct compression dictionary from among the various different available compression dictionaries stored in the dictionary library. The correct compression dictionary can be determined based on which compression dictionary matches the data type to be compressed, or based on which compression dictionary that achieves the most optimal compression ratio when compressing the data type of the selected data. As described herein, the most optimal compression ratio can be actively learned by the dictionary manager over time. At operation 612, the dictionary manager outputs a dictionary identification (ID) signal to the accelerator. As described herein the dictionary ID signal informs the accelerator as to which compression dictionary should be used to perform decompression on the selected data. The dictionary ID informs the accelerator to use the selected compression dictionary to perform decompression on the selected data. At operation 614, the accelerator accesses the millicode and obtains the correct compression dictionary corresponding to the dictionary ID signal. At operation 616, the accelerator decompresses the selected data using the compression dictionary obtained from the internal millicode, and the method ends at operation 618.

As described herein, various non-limiting embodiments provide a computer system that implements compression dictionary library and dictionary manager capable of determining the most optimal compression dictionary corresponding to the current data or data to be decompressed. Rather than forcing the accelerator to manage various different types of pre-defined compression dictionaries, the dictionary library either provides the accelerator with the correct compression dictionary or direct the accelerator to obtain to correct compression dictionary from the internal millicode. In this manner, the accelerator 210 is provided with the compression dictionary that provides the most optimal compression ratio, regardless of the type or size of the data or data stream to be compressed. Because the accelerator 210 itself is not required to manage or identify the most optimal compression dictionary for a given data type, the latency of the accelerator reduced and the overall computer system performance is improved.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising:
   a hardware controller including an accelerator configured to decompress a data stream requested by an application; and
   a host system including a dictionary manager configured to determine a compression dictionary from a plurality of different pre-defined compression dictionaries to decompress the data stream,
   wherein the accelerator obtains the determined compression dictionary, and decompresses the data stream according to the determined compression dictionary, the accelerator identifying the determined compression dictionary based on a dictionary identification (ID) signal indicating the determined compression dictionary from among the plurality of different pre-defined compression dictionaries.

2. The computer system of claim 1, wherein each pre-defined compression dictionary is assigned a binary value, and the dictionary identification (ID) signal includes the binary value corresponding to the determined compression dictionary.

3. The computer system of claim 2, further comprising an internal millicode storage area that stores a compression dictionary library including the plurality of different pre-defined compression dictionaries, wherein the internal millicode storage area is accessible independently of the host system, and wherein the accelerator obtains the determined compression dictionary from the internal millicode storage area.

4. The computer system of claim 3, wherein the dictionary manager determines the compression dictionary based on a data type of the data stream.

5. The computer system of claim 3, wherein the dictionary manager determines the compression dictionary based on a predicted compression ratio corresponding to a given pre-defined compression dictionary and a data type of the data stream.

6. The computer system of claim 5, wherein the dictionary manager actively learns the determined compression dictionary corresponding to a given data type of the data stream.

7. A method of controlling a computer system, the method comprising:
    requesting, via an application, decompression of a data stream;
    determining, via a dictionary manager controlled by a host system installed on the computer system, a compression dictionary from the plurality of different pre-defined compression dictionaries to decompress the data stream;
    decompressing the data stream, via the accelerator according to the determined compression dictionary;
    generating a dictionary identification (ID) signal that indicates the determined compression dictionary from among the plurality of different pre-defined compression dictionaries; and
    identifying the determined compression dictionary based on the dictionary identification (ID) signal.

8. The method of claim 7, further comprising:
    assigning a binary value to each pre-defined compression dictionary,
    wherein the dictionary identification (ID) signal includes the binary value corresponding to the determined compression dictionary.

9. The method of claim 7, further comprising:
    storing, via an internal millicode storage area, a compression dictionary library that includes the plurality of different pre-defined compression dictionaries;
    accessing, via the accelerator, the internal millicode storage area independently of the host system to obtain the determined compression dictionary; and
    decompressing the data stream, via the accelerator according to the determined compression dictionary obtained from the internal millicode storage area.

10. The method of claim 9, wherein determining the compression dictionary further comprises determining, via the dictionary manager, the compression dictionary based on a data type of the data stream.

11. The method of claim 9, wherein determining the compression dictionary further comprises determining, via the dictionary manager, the compression dictionary based on a predicted compression ratio corresponding to a given pre-defined compression dictionary and a data type of the data stream.

12. The method of claim 11, further comprising actively learning the determined compression dictionary to compress the data type of the data stream.

13. A computer program product to control computer system to decompress data, the computer program product comprising a computer readable storage medium having program instructions embodied therewith, the program instructions executable by an electronic computer processor to control the computer system to perform operations comprising:
    requesting, via an application, decompression of a data stream;
    determining, via a dictionary manager controlled by a host system installed on the computer system, a compression dictionary from the plurality of different pre-defined compression dictionaries to decompress the data stream; and
    decompressing the data stream, via the accelerator, according to the determined compression dictionary,
    generating a dictionary identification (ID) signal that indicates the determined compression dictionary from among the plurality of different pre-defined compression dictionaries; and
    identifying the determined compression dictionary based on the dictionary identification (ID) signal.

14. The computer program product of claim 13, further comprising:
    assigning a binary value to each pre-defined compression dictionary,
    wherein the dictionary identification (ID) signal includes the binary value corresponding to the determined compression dictionary.

15. The computer program product of claim 13, further comprising:
    storing, via an internal millicode storage area, a compression dictionary library that includes the plurality of different pre-defined compression dictionaries;
    accessing, via the accelerator, the internal millicode storage area independently of the host system to obtain the determined compression dictionary; and
    decompressing the data stream, via the accelerator according to the determined compression dictionary obtained from the internal millicode storage area.

16. The computer program product of claim 15, wherein determining the compression dictionary further comprises determining, via the dictionary manager, the compression dictionary based on at least one of a data type of the data stream and a predicted compression ratio corresponding to a given pre-defined compression dictionary and the data type of the data stream.

17. The computer program product of claim 16, further comprising actively learning, via the dictionary manager, the determined compression dictionary corresponding to a given data type of the data stream.

* * * * *